United States Patent
Genda et al.

(10) Patent No.: US 7,179,723 B2
(45) Date of Patent: Feb. 20, 2007

(54) WAFER PROCESSING METHOD

(75) Inventors: Satoshi Genda, Tokyo (JP); Toshiyuki Yoshikawa, Tokyo (JP); Ryugo Oba, Tokyo (JP); Kenji Furuta, Tokyo (JP); Nobuyasu Kitahara, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/986,371

(22) Filed: Nov. 12, 2004

(65) Prior Publication Data

US 2005/0106782 A1  May 19, 2005

(30) Foreign Application Priority Data

Nov. 18, 2003 (JP) ............... 2003-388104

(51) Int. Cl.
*H01L 21/301* (2006.01)
(52) U.S. Cl. .......... 438/462; 438/33; 438/68; 438/113; 257/E21.599
(58) Field of Classification Search .......... None
See application file for complete search history.

(56) References Cited

U.S. PATENT DOCUMENTS 5,597,767 A * 1/1997 Mignardi et al. ............ 438/14
6,420,245 B1 * 7/2002 Manor ........................ 438/460
2002/0001773 A1 * 1/2002 Saito et al. ............... 430/270.1
2005/0139962 A1 * 6/2005 Dani et al. .................. 257/620

FOREIGN PATENT DOCUMENTS

| JP | 2003-320466 | 11/2003 |
|----|-------------|---------|
| JP | 2004-188475 | 7/2004 |

* cited by examiner

*Primary Examiner*—Michael Lebentritt
*Assistant Examiner*—Cheung Lee
(74) *Attorney, Agent, or Firm*—Smith, Gambrell & Russell, LLP

(57) ABSTRACT

A laser beam processing method for processing a wafer by applying a laser beam to a predetermined area, comprising the steps of forming a resin film which absorbs a laser beam, on the surface to be processed of the wafer; applying a laser beam to the surface to be processed of the wafer through the resin film; and removing the resin film after the laser beam application step.

7 Claims, 14 Drawing Sheets

(a)

(b)

(a)

(b)

(a)

(b)

(a)

(b)

WAFER PROCESSING METHOD

FIELD OF THE INVENTION

The present invention relates to a laser processing method for carrying out predetermined processing by applying a laser beam to a predetermined area of a wafer such as a semiconductor wafer or an optical device wafer.

DESCRIPTION OF THE PRIOR ART

As is known to people of ordinary skill in the art, a semiconductor wafer comprising a plurality of semiconductor chips such as IC's or LSI'S, which are composed of a laminate consisting of an insulating film and a functional film and formed in a matrix on the front surface of a semiconductor substrate such as a silicon substrate is manufactured in the production process of a semiconductor device. The above semiconductor chips are sectioned by dividing lines called "streets" in this semiconductor wafer and separated from one another by cutting the semiconductor wafer along the streets. An optical device wafer comprising optical devices composed of gallium nitride-based compound semiconductors laminated in a plurality of areas that are sectioned by streets formed in a lattice pattern on the front surface of a sapphire substrate or the like, is also divided into individual optical devices such as light emitting diodes or laser diodes along dividing lines, and the optical devices are widely used in electric equipment. Cutting along the streets of the wafer such as a semiconductor wafer or optical device wafer is generally carried out with a cutting machine called "dicer". This cutting machine comprises a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle that is rotated at a high speed and a cutting blade mounted to the spindle. The cutting blade comprises a disk-like base and an annular cutting edge that is mounted to the side wall outer periphery of the base and formed as thick as about 20 μm by fixing diamond abrasive grains having a diameter of about 3 μm to the base by electroforming.

To improve the throughput of a semiconductor chip such as IC or LSI, a semiconductor wafer comprising semiconductor chips which are composed of a laminate consisting of a low-dielectric insulating film (Low-k film) formed of a film of an inorganic material such as SiOF or BSG (SiOB) or a film of an organic material such as a polyimide-based or parylene-based polymer film and a functional film forming circuits on the front surface of a semiconductor substrate such as a silicon substrate has recently been implemented.

When the above semiconductor wafer having a Low-k film laminated thereon is cut along the streets with the cutting blade, there is a problem that as the Low-k film is extremely fragile like mica, the Low-k film peels off, and this peeling reaches the circuits and causes a fatal damage to the semiconductor chips. Even in a semiconductor wafer having no Low-k film, when the film laminated on the front surface of the semiconductor substrate is cut along the streets with the cutting blade, a problem occurs that it peels off by destructive force generated by the cutting operation of the cutting blade, thereby damaging the semiconductor chips.

To solve the above problems, a dividing method for applying a laser beam to the semiconductor wafer along the streets to remove the laminate having a Low-k film forming the streets and then, positioning the cutting blade to the area from which the laminate has been removed to cut the semiconductor wafer is attempted. Such a processing machine for carrying out the above dividing method is disclosed in JP-A 2003-320466.

When a laser beam is applied along the streets of the semiconductor wafer, however, heat energy is concentrated on the area to which the laser beam has been applied to produce debris which adhere to a bonding pad connected to a circuit, thereby deteriorating the semiconductor chip.

To solve the above problem caused by the debris, JP-A 2004-188475 discloses a laser processing method in which the surface to be processed of a workpiece is covered with a protective film and a laser beam is applied to the workpiece through the protective film.

When the surface to be processed of the workpiece is covered with the protective film and a laser beam is applied to the workpiece through the protective film, however, the laser beam passes through the protective film to process the workpiece and its impact force peels off part of the protective film to cause debris to adhere to the outer periphery of the exposed chip.

SUMMARY OF THE INVENTION

It is an object of the present invention to provide a wafer processing method capable of preventing the influence of debris produced by applying a laser beam to a wafer.

According to the present invention, the above object can be attained by a laser processing method for processing a wafer by applying a laser beam to a predetermined area of the wafer, comprising:

a resin film forming step for forming a resin film which absorbs a laser beam, on the surface to be processed of the wafer;

a laser beam application step for applying a laser beam to the surface to be processed of the wafer through the resin film; and a resin film removal step for removing the resin film after the laser beam application step.

Preferably, the resin film is formed of a water-soluble light absorbing resin prepared by mixing a light absorber with a water-soluble resin. The above water-soluble light absorbing resin is a resin prepared by mixing a polyvinyl alcohol with titanium dioxide. The above resin film preferably has a light absorption coefficient of 1,000/cm or more.

The above wafer is a semiconductor wafer comprising semiconductor chips which are composed of a laminate consisting of an insulating film and a functional film and formed on the front surface of a semiconductor substrate and which are sectioned by streets, the above resin film forming step is to form the resin film which absorbs a laser beam, on the front surface of the semiconductor substrate, and the above laser beam application step is to form laser grooves which reach the semiconductor substrate by applying a laser beam to the laminate forming the streets through the resin film. The semiconductor wafer having the laser grooves formed by the laser beam application step is cut along the laser grooves with a cutting blade to be divided into individual semiconductor chips.

The above wafer is an optical device wafer which has a plurality of streets formed in a lattice pattern on the front surface of a substrate and comprises optical devices formed in a plurality of areas sectioned by the plurality of streets, the above resin film forming step is to form the resin film which absorbs a laser beam, on the back surface of the substrate, and the above laser beam application step is to form laser grooves in the substrate by applying a laser beam to the back surface of the substrate through the resin film. The optical device wafer having the laser grooves formed by the laser beam application step is divided into individual optical devices along the laser grooves by applying external force to the laser grooves.

Since in the laser processing method of the present invention, the resin film that absorbs a laser beam is formed on the surface to be processed of the wafer and then, the laser beam is applied to the wafer through the resin film, the resin film absorbing the laser beam becomes a processing start point. Since the wafer is processed by the application of the laser beam after the processing start point is formed in the resin film, the generation of impact force caused by the laser beam passing through the resin film can be prevented, thereby suppressing the partial peeling of the resin film. Therefore, it is possible to prevent debris from adhering to the outer periphery of the chip exposed by the partial peeling of the resin film.

DETAILED DESCRIPTION OF THE PREFERRED EMBODIMENT

The wafer processing method of the present invention will be described in more detail with reference to the accompanying drawings.

Figure 1:
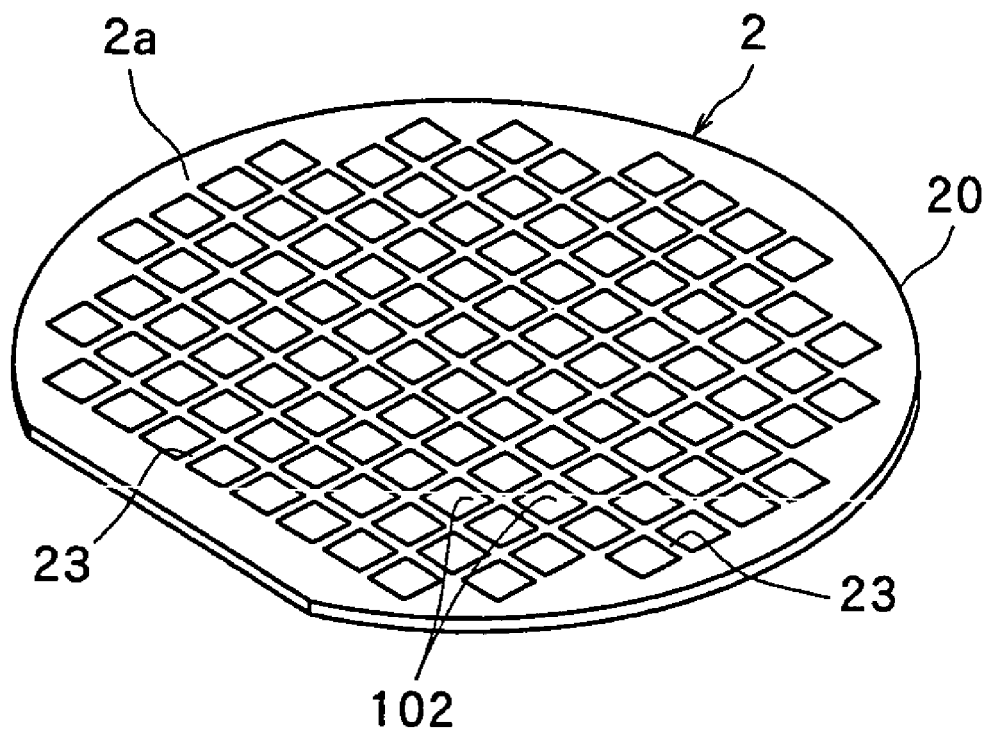
FIG. 1 is a perspective view of a semiconductor wafer to be processed by the wafer processing method of the present invention.
Figure 2:
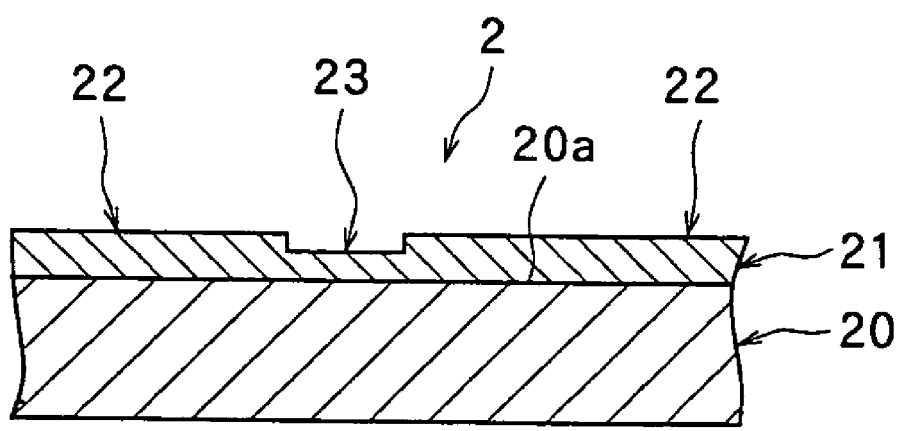
FIG. 2 is an enlarged sectional view of the semiconductor wafer shown in FIG. 1.

FIG. 1 is a perspective view of a semiconductor wafer as a workpiece to be processed by the wafer processing method of the present invention and FIG. 2 is an enlarged sectional view of the principal section of the semiconductor wafer shown in FIG. 1. In the semiconductor wafer 2 shown in FIG. 1 and FIG. 2, a plurality of semiconductor chips 22 such as IC's or LSI's, which are composed of a laminate 21 consisting of an insulating film and a functional film forming circuits and formed in a matrix on the front surface 20a of a semiconductor substrate 20 such as a silicon substrate. The semiconductor chips 22 are sectioned by streets 23 formed in a lattice pattern. In the illustrated embodiment, the insulating film forming the laminate 21 is an $SiO_2$ film or a low-dielectric insulating film (Low-k film) formed of a film of an inorganic material such as SiOF or BSG (SiOB) or a film of an organic material such as a polyimide-based or parylene-based polymer film.

Figure 3:
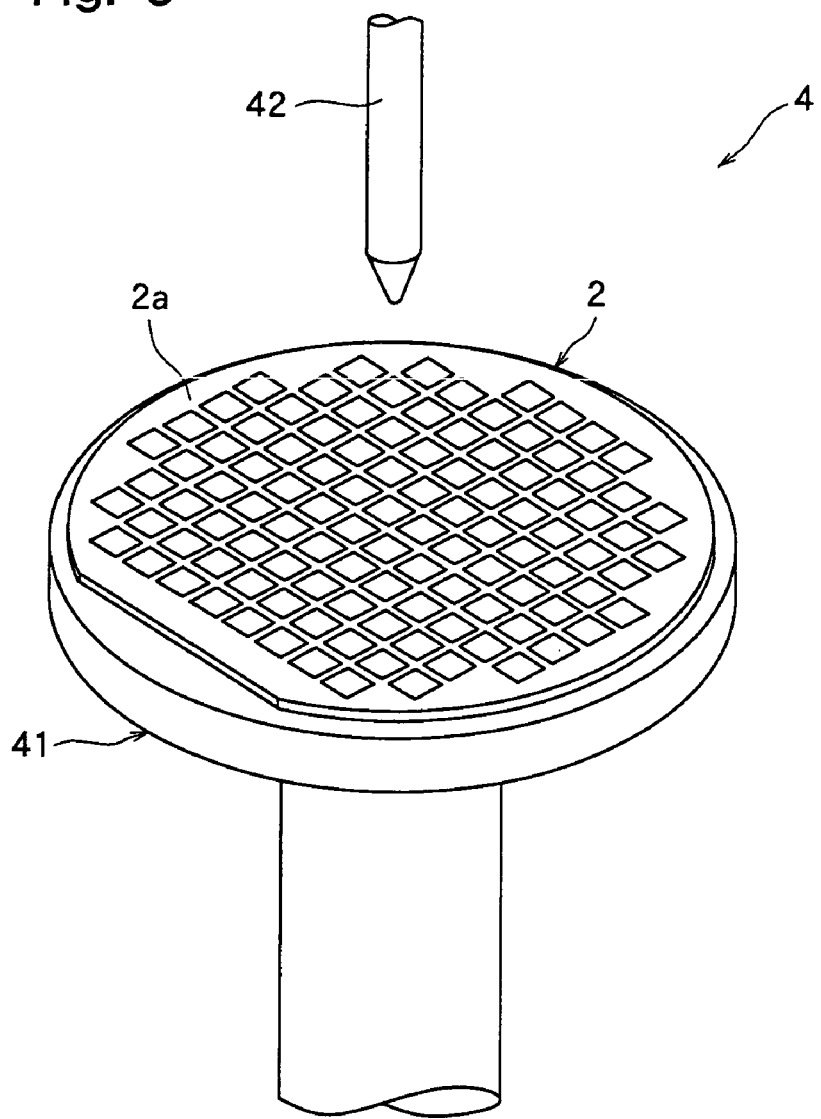
FIG. 3 is an explanatory diagram showing an embodiment of the resin film forming step in the wafer processing method of the present invention.
Figure 4:
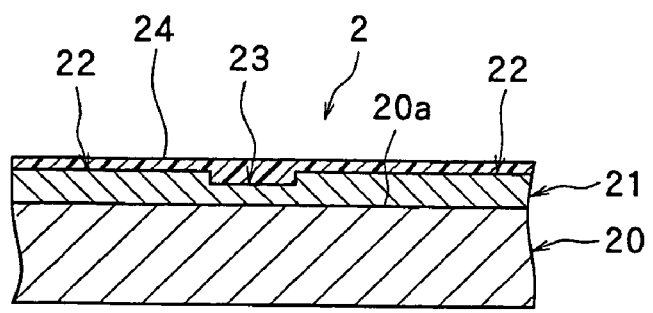
FIG. 4 is an enlarged sectional view of the principal section of a semiconductor wafer covered with a resin film by the resin film forming step shown in FIG. 3.

For the laser processing of the above semiconductor wafer 2 along the streets 23, the step of forming a resin film which absorbs a laser beam on the front surface 2a that is the surface to be processed of the above semiconductor wafer 2, is first carried out. This resin film forming step is to apply a resin which absorbs a laser beam to the front surface 2a of the semiconductor wafer 2 with a spin coater 4 as shown in FIG. 3. That is, the spin coater 4 comprises a chuck table 41 having a suction-holding means and a nozzle 42 arranged above the center portion of the chuck table 41. The semiconductor wafer 2 is placed on the chuck table 41 of the spin coater 4 in such a manner that the front surface 2a faces up, and a liquid resin is dropped on the center portion of the front surface of the semiconductor wafer 2 from the nozzle 42 while the chuck table 41 is rotated. Thereby, the liquid resin flows to the outer periphery of the semiconductor wafer 2 by centrifugal force to cover the front surface 2a of the semiconductor wafer 2. This liquid resin cures by itself along the passage of time to form a resin film 24 having a thickness of about 1 to 5 μm on the front surface 2a of the semiconductor wafer 2 as shown in FIG. 4. The resin for covering the front surface 2a of the semiconductor wafer 2 is desirably a water-soluble resist.

The resin forming the above resin film 24 will be described hereinbelow. It is important that this resin should have the property of absorbing a laser beam as described above, and its light absorption coefficient is preferably 1,000/cm or more. The resin forming the above resin film 24 is desirably a water-soluble resin. A mixture of a polyvinyl alcohol and titanium dioxide as a light absorber may be used as the resin. The light absorber may be suitably selected from titanium dioxide, cerium oxide, carbon black, zinc oxide, silicon powder, yellow iron oxide, sulfide pigment, nitroso pigment, nitro pigment, azo lake pigment, lake pigment, phthalocyanine pigment, indanthrene pigment and quinacridone pigment according to the wavelength of a laser beam in use.

Figure 5:
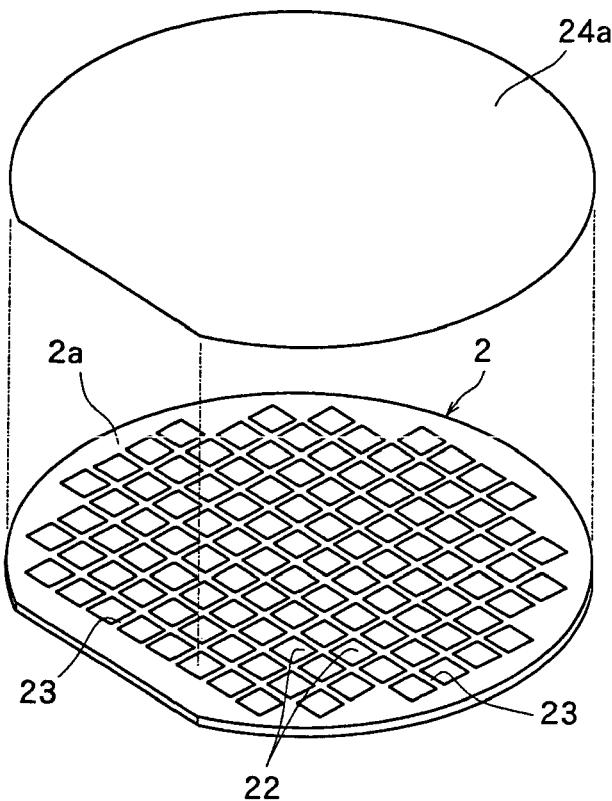
FIG. 5 is an explanatory diagram showing another embodiment of the resin film forming step in the wafer processing method of the present invention.

As another embodiment to form the resin film 24 on the front surface 2a of the above semiconductor wafer 2, a water-soluble resin sheet member 24a having the above property of absorbing a laser beam may be affixed to the front surface 2a of the semiconductor wafer 2, as shown in FIG. 5.

Figure 6:
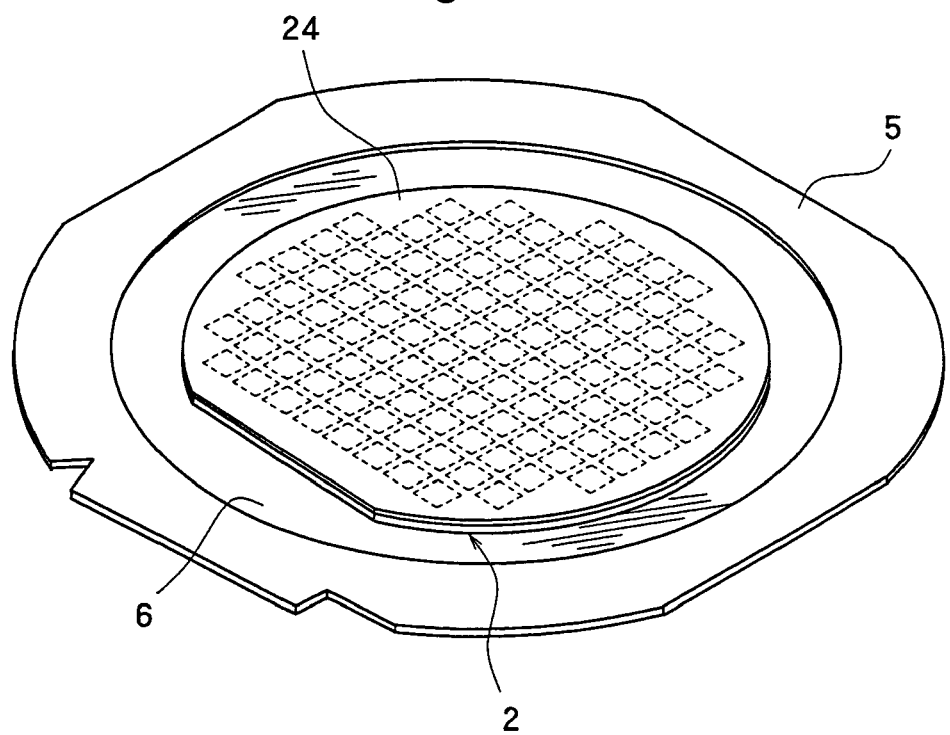
FIG. 6 is a perspective view showing a state of the semiconductor wafer covered with a resin film being supported on an annular frame by a protective tape.

After the resin film 24 is formed on the front surface 2a of the semiconductor wafer 2 by the above resin film forming step, the back surface of the semiconductor wafer 2 is put to a protective tape 6 affixed to an annular frame 5 as shown in FIG. 6.

The laser beam application step of applying a laser beam to the semiconductor wafer 2 having the resin film 24 formed on the front surface 2a through the resin film 24 is carried out next. This laser beam application step is carried out by using a laser beam machine shown in FIGS. 7 to 9. The laser beam machine 7 shown in FIGS. 7 to 9 comprises a chuck table 71 for holding a workpiece, a laser beam application means 72 for applying a laser beam to the workpiece held on the chuck table 51 and an image pick-up means 73 for picking up an image of the workpiece held on the chuck table 71. The chuck table 71 is so constituted as to suction-hold the workpiece and to be moved by a moving mechanism (not shown) in a processing-feed direction indicated by an arrow X and an indexing-feed direction indicated by an arrow Y in FIG. 7.

Figure 8:
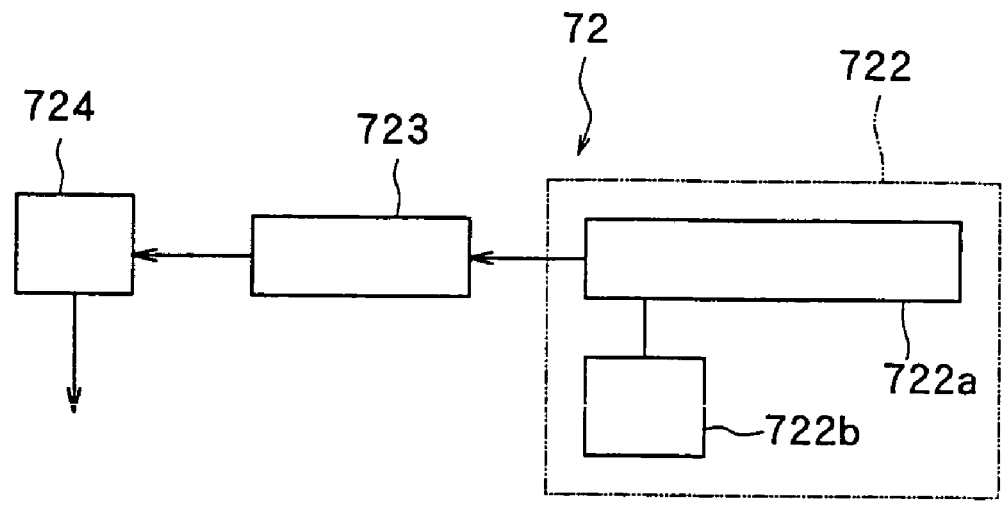
FIG. 8 is a block diagram schematically showing the constitution of laser beam application means provided in the laser beam machine shown in FIG. 7.
Figure 9:
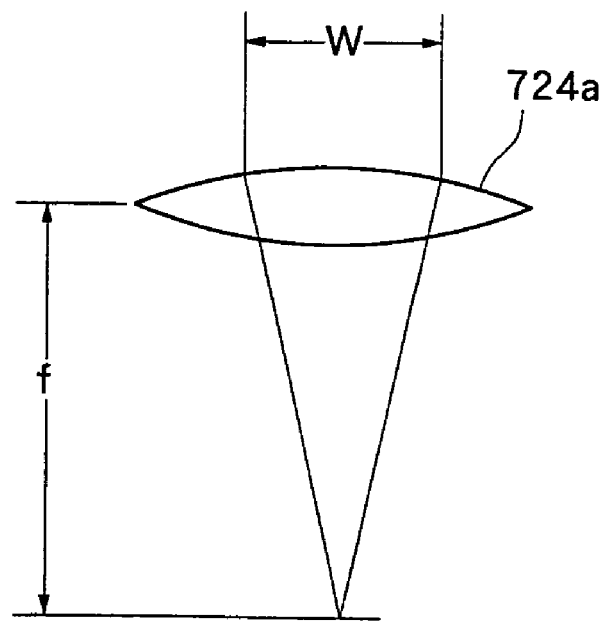
FIG. 9 is a schematic diagram for explaining the focusing spot diameter of a laser beam.

The above laser beam application means 72 has a cylindrical casing 721 arranged substantially horizontally. In the casing 721, there are installed a pulse laser beam oscillation means 722 and a transmission optical system 723, as shown in FIG. 8. The pulse laser beam oscillation means 722 is constituted by a pulse laser beam oscillator 722a composed of a YAG laser oscillator or YVO4 laser oscillator and a repetition frequency setting means 722b connected to the pulse laser beam oscillator 722a. The transmission optical system 723 comprises suitable optical elements such as a beam splitter, etc. A condenser 724 housing condensing lenses (not shown) constituted by a set of lenses that may be a known formation is attached to the end of the above casing 721. A laser beam oscillated from the above pulse laser beam oscillation means 722 reaches the condenser 724 through the transmission optical system 723 and is applied from the condenser 724 to the workpiece held on the above chuck table 71 at a predetermined focusing spot diameter D. This focusing spot diameter D is defined by the expression D (μm)=4×λ×f/(π×W) (wherein λ is the wavelength (μm) of a pulse laser beam, W is the diameter (mm) of the pulse laser beam applied to an objective condenser lens 724a, and f is the focusing distance (mm) of the objective condenser lens 724a) when the pulse laser beam having a Gauss distribution is applied through the objective condenser lens 724a of the condenser 724 as shown in FIG. 9.

The image pick-up means 73 mounted to the end of the casing 721 constituting the above laser beam application means 72 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that is not shown.

The laser beam application step which is carried out by using the above laser beam machine 7 will be described with reference to FIG. 7, FIGS. 10(a) and 10(b), FIG. 11 and FIG. 12.

Figure 7:
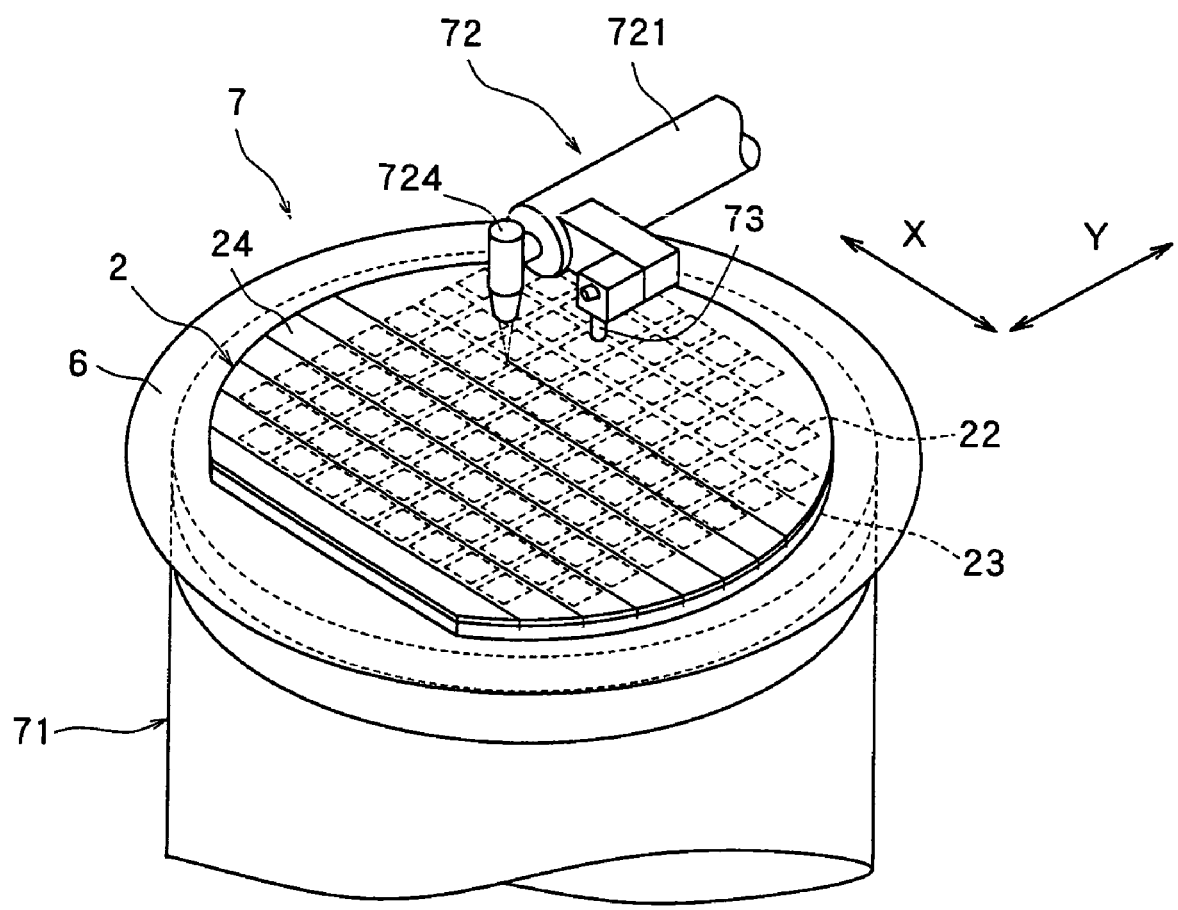
FIG. 7 is a perspective view of the principal section of a laser beam machine for carrying out the laser beam application step in the wafer processing method of the present invention.

In the laser beam application step, the semiconductor wafer 2 is first placed on the chuck table 71 of the laser beam machine 7 shown in FIG. 7 in such a manner that a side on which the resin film 24 is formed, faces up, and suction-held on the chuck table 71. In FIG. 7, the annular frame 5 having the protective tape 6 affixed thereto is omitted. The annular frame 5 is held by a suitable frame holding means of the chuck table 71.

The chuck table 71 suction-holding the semiconductor wafer 2 as described above is positioned right below the image pick-up means 73 by a moving mechanism that is not shown. After the chuck table 71 is positioned right below the image pick-up means 73, alignment work for detecting the processing area to be processed of the semiconductor wafer 2 is carried out by the image pick-up means 73 and the control means that is not shown. That is, the image pick-up means 73 and the control means (not shown) carry out image processing such as pattern matching so on to align a street 23 formed in a predetermined direction of the semiconductor wafer 2 with the condenser 724 of the laser beam application means 72 for applying a laser beam along the street 23, thereby performing the alignment of a laser beam application position. The alignment of the laser beam application position is also similarly carried out on streets that are formed on the semiconductor wafer 2 and extend in a direction perpendicular to the above predetermined direction. At this moment, although the resin film 24 is formed on the front surface 2a on which street 23 is formed, of the semiconductor wafer 2, alignment can be carried out from the front surface by picking up an image with infrared radiation even when the resin film 24 is not transparent.

Figure 10:
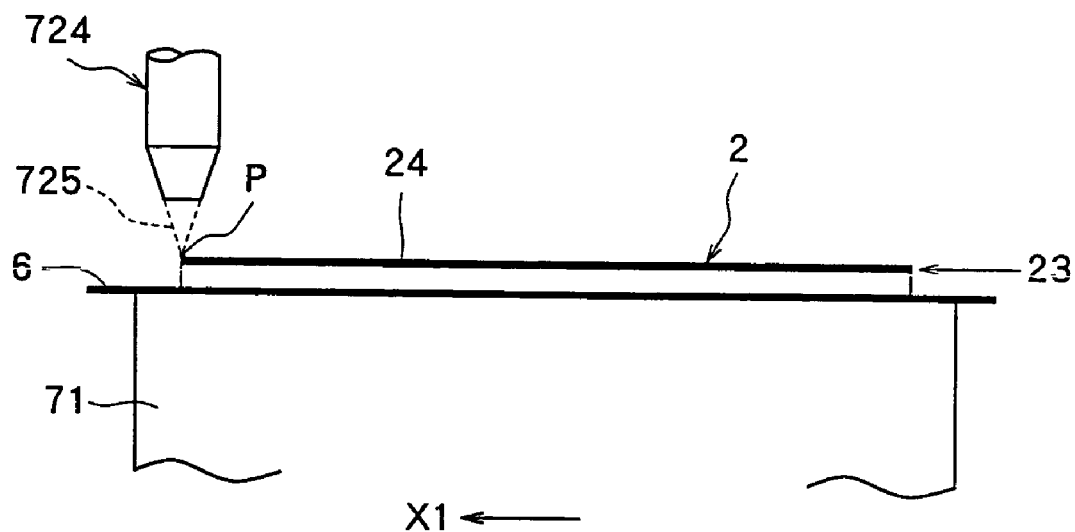
FIGS. 10(a) and 10(b) are diagrams for explaining the laser beam application step in the wafer processing method of the present invention.
Figure 10:
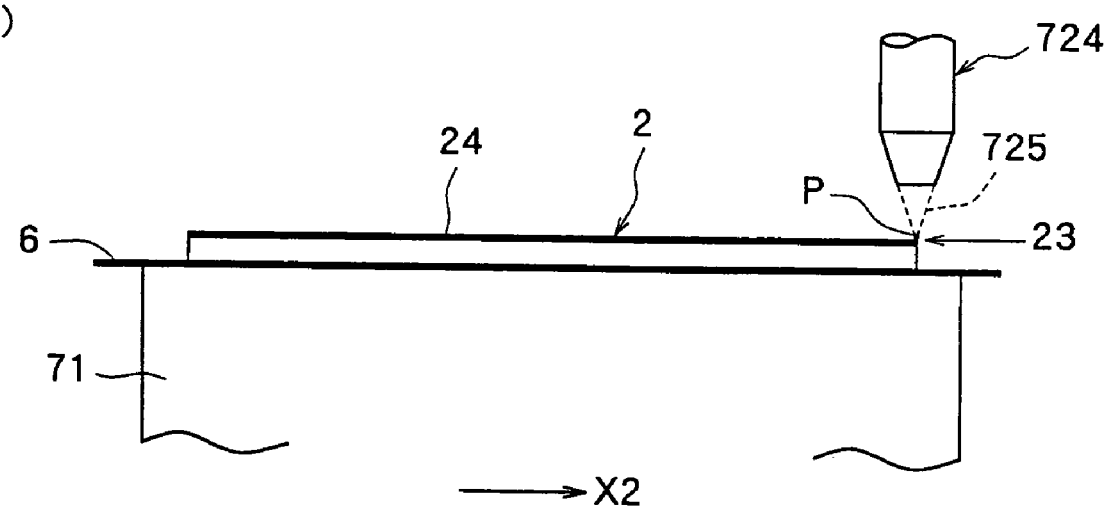

After the street 23 formed on the semiconductor wafer 2 held on the chuck table 71 is detected and the alignment of the laser beam application position is carried out as described above, the chuck table 71 is moved to a laser beam application area where the condenser 724 of the laser beam application means 72 for applying a laser beam is located as shown in FIG. 10(a) to bring one end (left end in FIG. 10(a)) of the predetermined street 23 to a position right below the condenser 724 of the laser beam application means 72. The chuck table 71, that is, the semiconductor wafer 2 is moved in the direction indicated by the arrow X1 in FIG. 10(a) at a predetermined feed rate while a pulse laser beam 725 is applied from the condenser 724. When the application position of the laser beam application means 72 reaches the other end (right end in FIG. 10(b)) of the street 23 as shown in FIG. 10(b), the application of the pulse laser beam 725 is suspended and the movement of the chuck table 71, that is, the semiconductor wafer 2 is stopped.

Thereafter, the chuck table 71, that is, the semiconductor wafer 2 is moved about 10 to 20 μm to a direction (indexing-feed direction) perpendicular to the sheet. The chuck table 71, that is, the semiconductor wafer 2 is then moved in the direction indicated by the arrow X2 in FIG. 10(b) at a predetermined feed rate while the pulse laser beam 725 is applied from the laser beam application means 72. When the application position of the laser beam application means 72 reaches the position shown in FIG. 10(a), the application of the pulse laser beam 725 is suspended and the movement of the chuck table 71, that is, the semiconductor wafer 2 is stopped.

Figure 11:
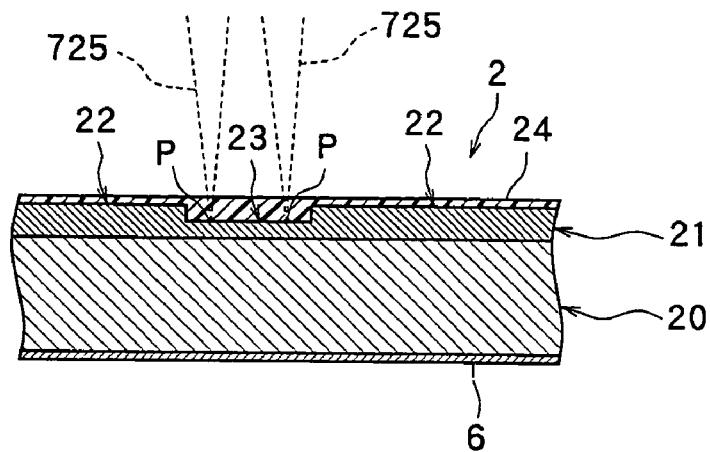
FIG. 11 is an explanatory diagram showing a laser beam application position in the laser beam application step in the wafer processing method of the present invention.

While the chuck table 71, that is, the semiconductor wafer 2 is reciprocated as described above, the pulse laser beam 725 is applied to the street 23 with its focusing point P on the top surface of the street 23 at a wider interval than the width of the cutting blade later described as shown in FIG. 11.

Figure 12:
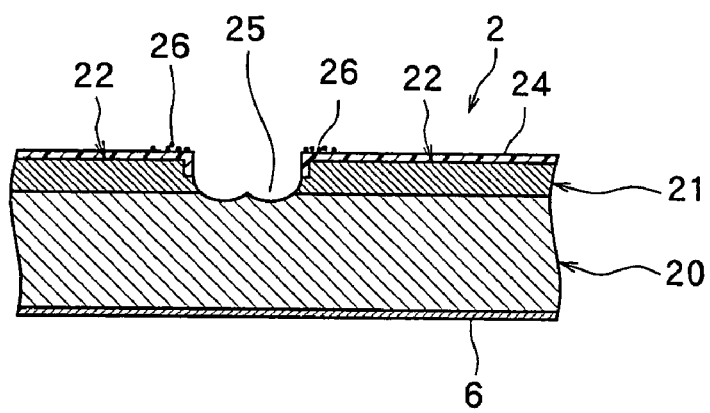
FIG. 12 is an enlarged sectional view of the principal section of the semiconductor wafer having a laser groove formed by the laser beam application step in the wafer processing method of the present invention.

The above laser beam application step is carried out under the following processing conditions, for example.
Light source of laser beam: YVO4 laser or YAG laser
Wavelength: 355 nm
Repetition frequency: 50 to 100 kHz
Output: 0.3 to 4.0 W
Focusing spot diameter: 9.2 μm
Processing-feed rate: 1 to 800 mm/sec A laser groove 25 wider than the width of the cutting blade later described is formed in the laminate 21 forming the street 23 of the semiconductor wafer 2, along the street 23 by carrying out the above laser beam application step, as shown in FIG. 12. The laser groove 25 reaches the semiconductor substrate 20 to remove the laminate 21. When the pulse laser beam 725 is applied to the laminate 21 forming the street 23 through the resin film 24 as shown in FIG. 11, the resin film 24 serves as a processing start point because it has the property of absorbing a laser beam. Since the laminate 21 and the semiconductor substrate 20 are processed by the application of the laser beam 725 after the processing start point has been formed in the resin film 24, the generation of impact force caused by the transmission of the pulse laser beam through the resin film can be prevented, thereby suppressing the peeling of the insulating film forming the laminate 21 and the partial peeling of the resin film 24. Therefore, it is possible to prevent debris from adhering to the periphery of the semiconductor chip 22 exposed by the partial peeling of the resin film 24. In the above laser beam application step, debris are produced by the processing of the laminate 21 and the semiconductor substrate 20 by the application of the pulse laser beam 725. However, as shown in FIG. 12, the debris 26 are blocked by the resin film 24 and therefore, adhere to the front surface of the resin film 24 but not to the semiconductor chip 22.

After the laser beam application step is carried out along the predetermined street as described above, the chuck table 71, that is, the semiconductor wafer 2 held on the chuck table 71 is indexing-moved a distance corresponding to the interval between the streets 23 in the direction shown in the arrow Y (indexing step) to carry out the above laser beam application step. After the above laser beam application step and the indexing step are carried out on all the streets extending in the predetermined direction, the chuck table 71, therefore, the semiconductor wafer 2 held on the chuck table 71 is turned at 90° to carry out the above laser beam application step and indexing step along streets extending in a direction perpendicular to the above predetermined direction, thereby making it possible to form laser grooves 25 in all the streets 23 formed on the semiconductor wafer 2.

Figure 13:
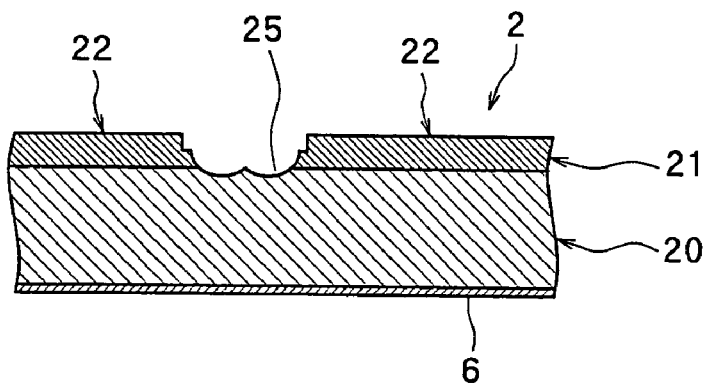
FIG. 13 is an enlarged sectional view of the principal section of the semiconductor wafer from which the resin film formed on the front surface has been removed by the resin film removal step in the wafer processing method of the present invention.

The step of removing the resin film 24 formed on the front surface 2a of the semiconductor wafer 2 that is put to the protective tape 6 affixed to the annular frame 5 comes next. In this resin film removal step, as the resin film 24 is formed of a water-soluble resin as described above, as shown in FIG. 13, the resin film 24 can be washed away with water. The debris 26, which have been produced in the above laser beam application step and adhered to the front surface of the resin film 24 are also flushed away together with the resin film 24. Since the resin film 24 is formed of a water-soluble resin in the illustrated embodiment, the removal of the resin film 24 is extremely easy.

Figure 14:
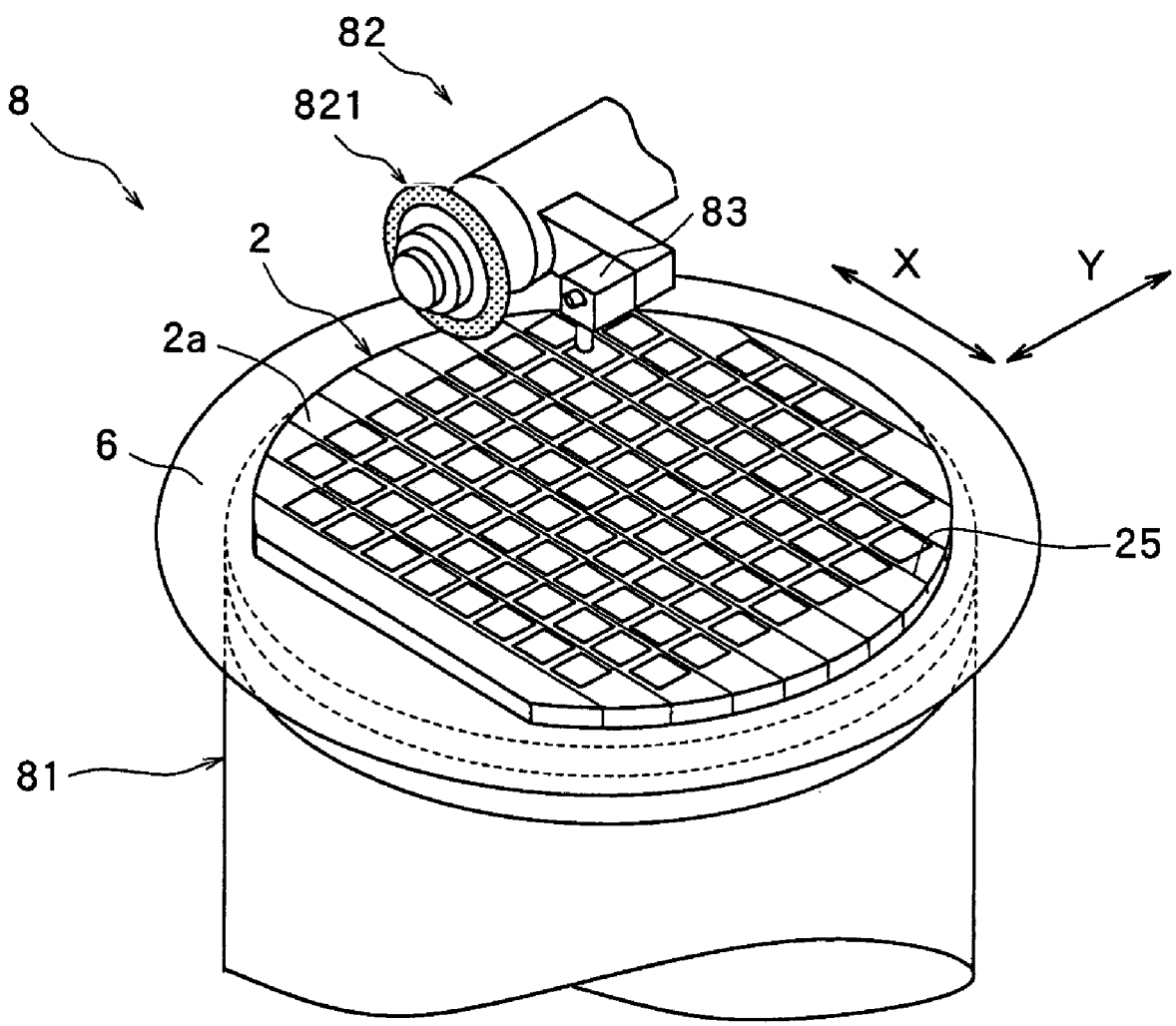
FIG. 14 is a perspective view of the principal section of a cutting machine for carrying out the cutting step in the wafer processing method of the present invention.

The step of cutting the semiconductor wafer 2 along the laser grooves 25 formed in the streets 23 of the semiconductor wafer 2 follows the above resin film removal step. In this cutting step, a cutting machine 8 which is generally used as a dicing machine as shown in FIG. 14 may be used. That is, the cutting machine 8 comprises a chuck table 81 having suction-holding means, a cutting means 82 having a cutting blade 821, and an image pick-up means 83 for picking up an image of the workpiece held on the chuck table 81.

The cutting step to be carried out with the above cutting machine 8 will be described with reference to FIGS. 14 to 16.

That is, as shown in FIG. 14, the semiconductor wafer 2 which has been subjected to the above laser beam application step and resin film removal step is placed on the chuck table 81 of the cutting machine 8 in such a manner that the front surface 2a of the semiconductor wafer 2 faces up, and held on the chuck table 81 by a suction means that is not shown. The chuck table 81 suction-holding the semiconductor wafer 2 is positioned right below the image pick-up means 83 by a moving mechanism that is not shown.

After the chuck table 81 is positioned right below the image pick-up means 83, alignment work for detecting the area to be cut of the semiconductor wafer 2 is carried out by the image pick-up means 83 and the control means that is not shown. That is, the image pick-up means 83 and the control means (not shown) carry out image processing such as pattern matching, etc. to align a street 23 formed in a predetermined direction of the semiconductor wafer 2 with the cutting blade 821 for cutting along a laser groove 25, thereby performing the alignment of the area to be cut. The alignment of the area to be cut is also carried out on streets 23 that are formed on the semiconductor wafer 2 and extend in a direction perpendicular to the above predetermined direction.

After the street 23 formed on the semiconductor wafer 2 held on the chuck table 81 is detected and the alignment of the area to be cut is carried out as described above, the chuck table 81 holding the semiconductor wafer 2 is moved to the cutting start position of the area to be cut. At this point, as shown in FIG. 15(a), the semiconductor wafer 2 is brought to a position where one end (left end in FIG. 15(a)) of the street 23 to be cut is located a predetermined distance on the right side from right below the cutting blade 821. The semiconductor wafer 2 is also positioned such that the cutting blade 821 is located in the center portion of the laser groove 25 formed in the street 23.

Figure 15:
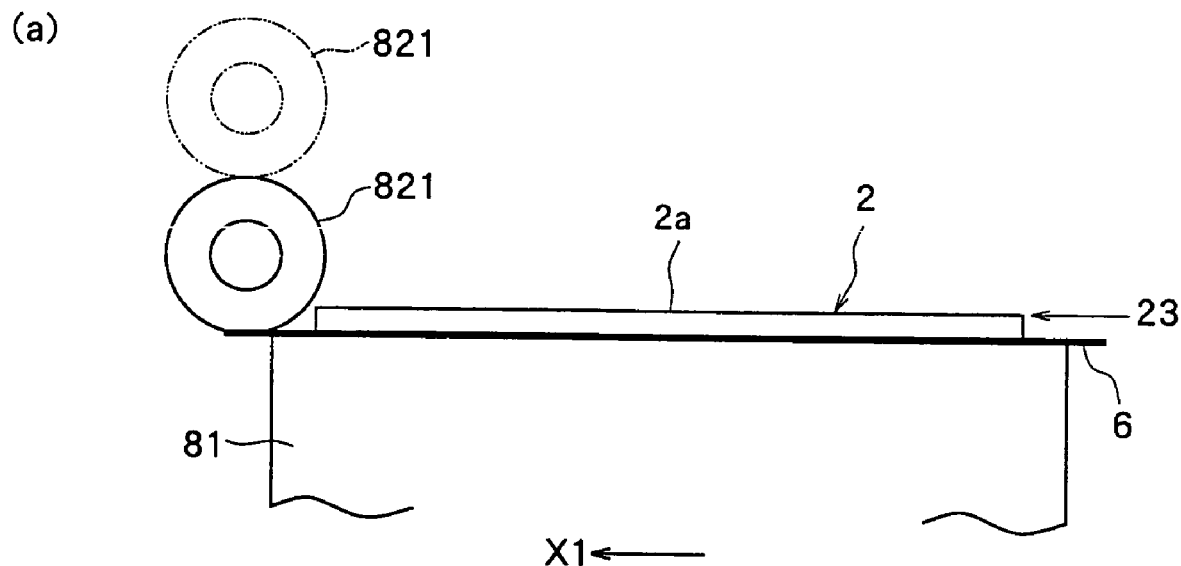
FIGS. 15(a) and 15(b) are diagrams for explaining the cutting step in the wafer processing method of the present invention.
Figure 15:
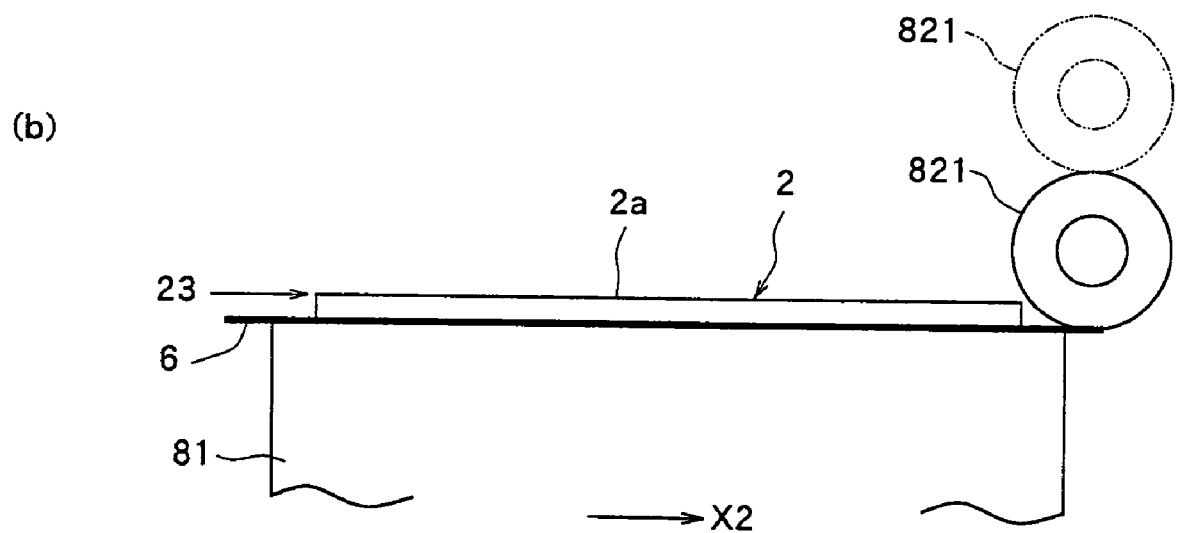
Figure 16:
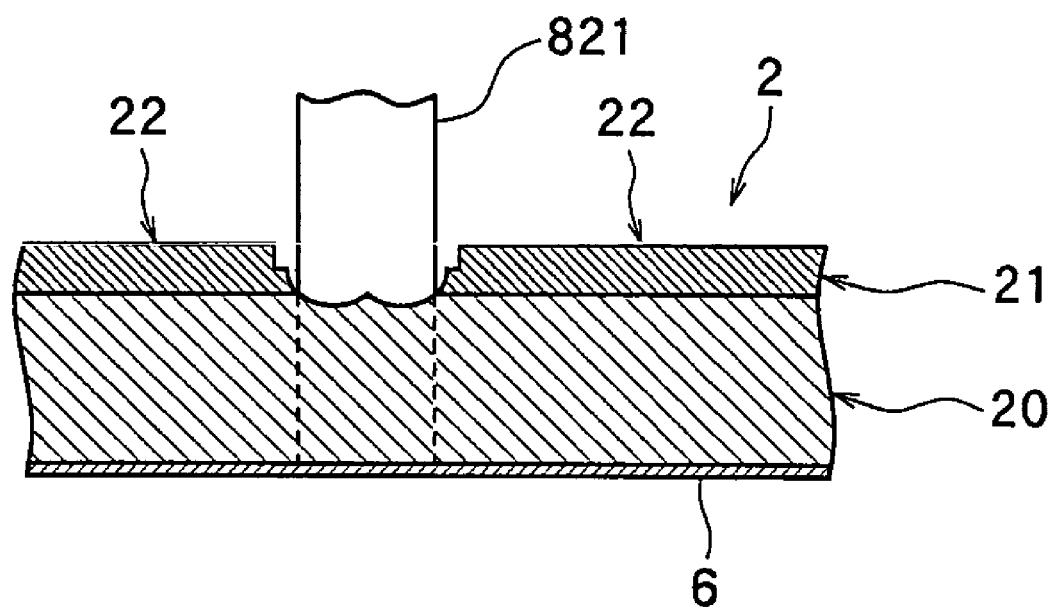
FIGS. 16(a) and 16(b) are explanatory diagrams showing that the semiconductor wafer is cut along the laser grooves by the cutting step in the wafer processing method of the present invention.
Figure 16:
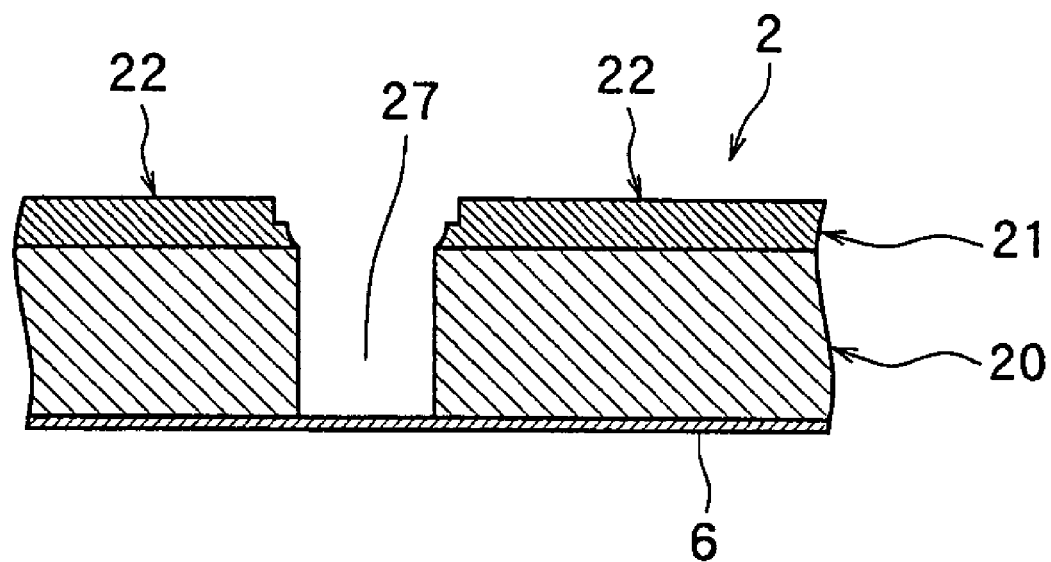

After the chuck table 81, that is, the semiconductor wafer 2 has been thus brought to the cutting start position of the area to be cut, the cutting blade 821 is moved down from its standby position shown by a two-dot chain line in FIG. 15(*a*) to a predetermined cutting position shown by a solid line in FIG. 15(*a*). This cutting-feed position is set to a position where the lower end of the cutting blade 821 reaches the protective tape 6 affixed to the back surface of the semiconductor wafer 2 as shown in FIG. 16(*a*).

Thereafter, the cutting blade 821 is rotated at a predetermined revolution, and the chuck table 81, that is, the semiconductor wafer 2 is moved in the direction indicated by the arrow X1 in FIG. 15(*a*) at a predetermined cutting-feed rate. When the chuck table 81, that is, the semiconductor wafer 2 is moved to reach a position where the other end (right end in FIG. 15(*b*)) of the street 23 is located on the left side by a predetermined distance from right below the cutting blade 821 as shown in FIG. 15(*b*), the movement of the chuck table 81, that is, the semiconductor wafer 2 is stopped. By thus cutting-moving the chuck table 81, that is, the semiconductor wafer 2, a cut groove 27 which reaches the back surface is formed along the laser groove 25 formed in the street 23 of the semiconductor wafer 2, as shown in FIG. 16(*b*), to cut the semiconductor wafer 2. In this cutting step, only the semiconductor substrate 20 is cut with the cutting blade 821. Therefore, the peeling of the laminate 21 caused by cutting the laminate 21 formed on the front surface of the semiconductor substrate 20 with the cutting blade 821 can be prevented in advance.

The above cutting step is carried out under the following processing conditions, for example.
Cutting blade: outer diameter of 52 mm, thickness of 20 μm
Revolution of cutting blade: 30,000 rpm
Cutting-feed rate: 50 mm/sec Thereafter, the cutting blade 821 is positioned to the standby position shown by the two-dot chain line in FIG. 15(*b*), and the chuck table 81, that is, the semiconductor wafer 2 is moved in the direction indicated by the arrow X2 in FIG. 15(*b*) to return to the position shown in FIG. 15(*a*). The chuck table 81, that is, the semiconductor wafer 2 is indexing-fed by an amount corresponding to the interval between the streets 23 in a direction (indexing-feed direction) perpendicular to the sheet to bring a street 23 to be cut next to a position corresponding to the cutting blade 821. After the street 23 to be cut next is located at a position corresponding to the cutting blade 821, the above-mentioned cutting step is carried out.

The above-mentioned cutting step is carried out on all the streets 23 formed on the semiconductor wafer 2. As a result, the semiconductor wafer 2 is cut along the laser grooves 25 formed in the streets 23 and is divided into individual semiconductor chips 22. Since in the cutting step, cutting is carried out while cutting water (pure water) is supplied, the resin film can be removed by the cutting water supplied without providing the above resin film removal step independently and hence, the cutting step may also serve as the resin film removal step.

A description is subsequently given of the processing method for dividing an optical device wafer into individual optical devices with reference to FIGS. 17 to 23.

Figure 17:
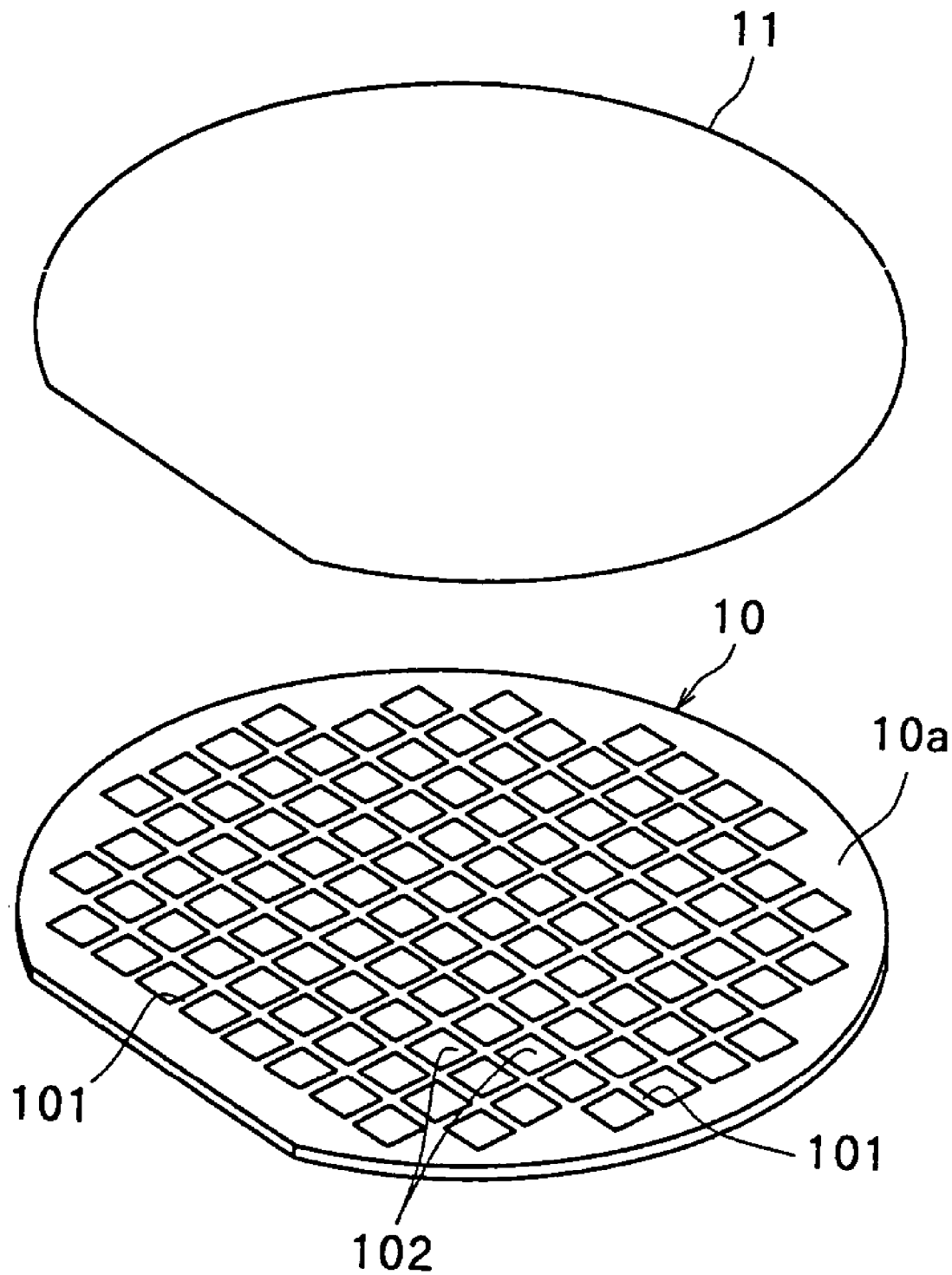
FIG. 17 is a perspective view of an optical device wafer to be processed by the wafer processing method of the present invention.

FIG. 17 is a perspective view of an optical device wafer 10. In the optical device wafer 10 shown in FIG. 17, a plurality of streets 101 are formed in a lattice pattern on the front surface 10*a* of a sapphire substrate, and optical devices 102 comprising a laminated gallium nitride-based compound semiconductor and the like are formed in a plurality of areas sectioned by the plurality of streets 101. To divide the thus constituted optical device wafer 10 into individual optical devices 102, a protective tape 11 is affixed to the front surface 10*a* thereof.

Figure 18:
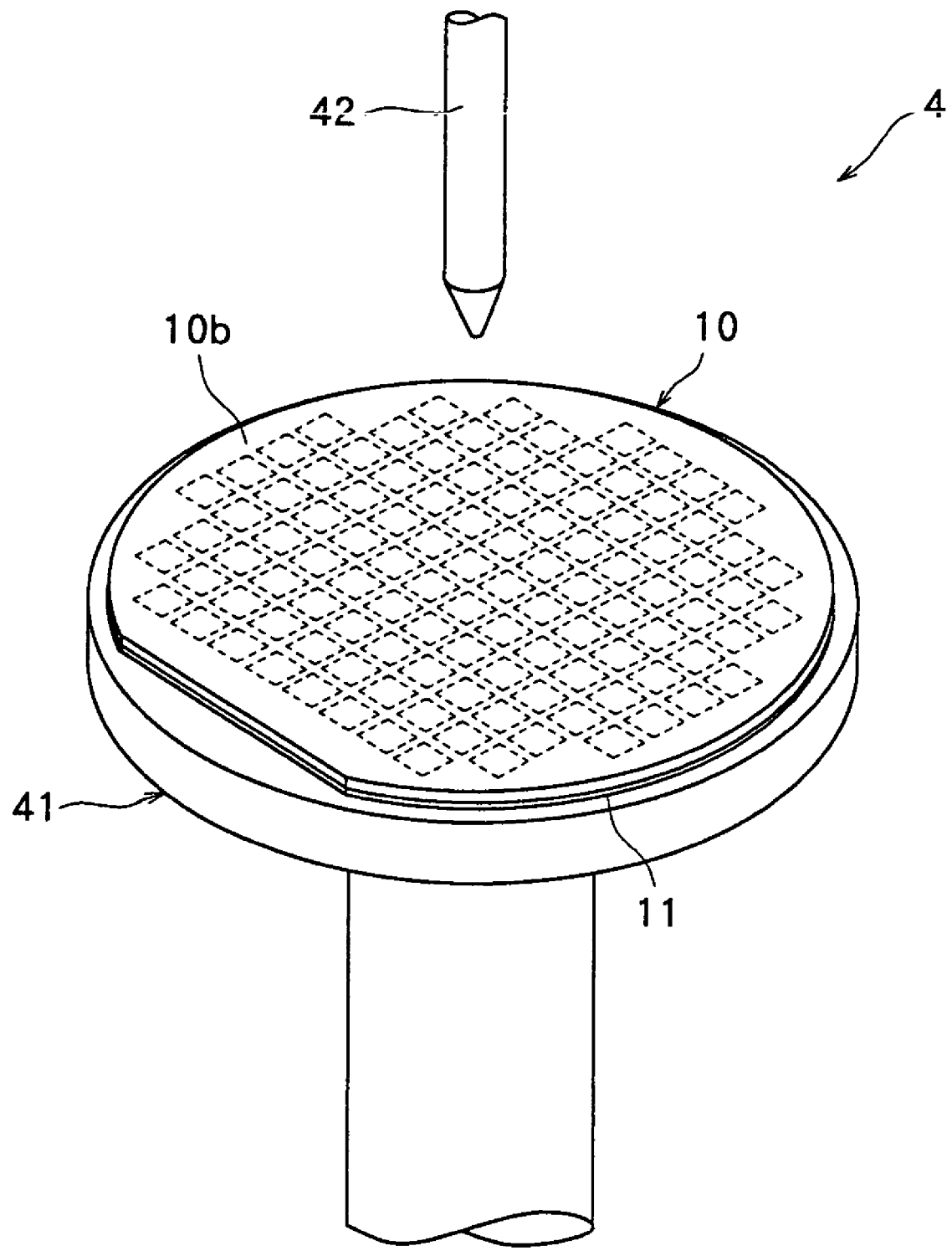
FIG. 18 is an explanatory diagram showing that the resin film forming step is carried out on the optical device wafer in the wafer processing method of the present invention.
Figure 19:
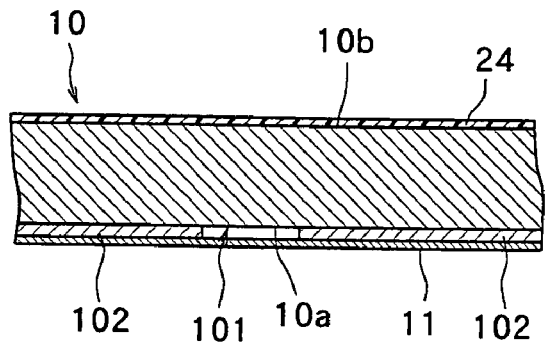
FIG. 19 is an enlarged sectional view of the principal section of the optical device wafer covered with the resin film by the resin film forming step shown in FIG. 18.

The step of forming a resin film which absorbs a laser beam on the back surface 10*b* as the surface to be processed of the optical device wafer 10 comes after the protective tape 11 is affixed to the front surface 10*a* of the optical device wafer 10 as described above. This resin film forming step is carried out by using the above-mentioned spin coater 4 shown in FIG. 3, for example. That is, as shown in FIG. 18, the optical device wafer 10 is placed on the chuck table 41 of the spin coater 4 in such a manner that the back surface 10*b* faces up, and a liquid resin which absorbs a laser beam is dropped on the center portion of the back surface of the optical device wafer 10 from the nozzle 42 while the chuck table 41 is rotated. Thereby, the liquid resin flows to the outer periphery of the optical device wafer 10 by centrifugal force to cover the back surface 10*b* of the optical device wafer 10. This liquid resin cures by itself along the passage of time to form a resin film 24 having a thickness of about 1 to 5 μm on the back surface 10*b* of the optical device wafer 10, as shown in FIG. 19.

Figure 20:
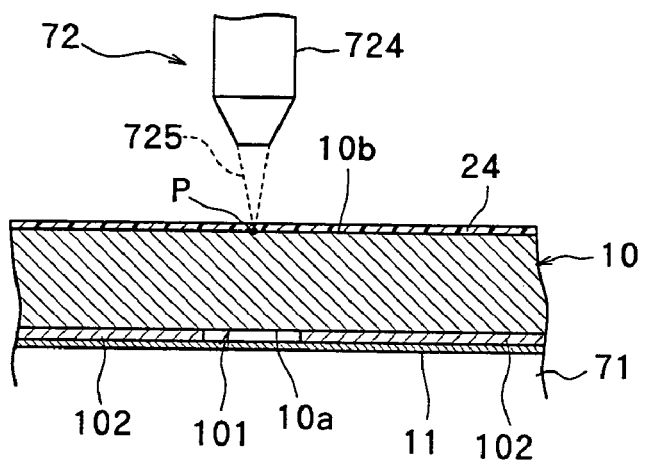
FIG. 20 is an explanatory diagram showing a laser beam application position in the laser beam application step in the wafer processing method of the present invention.

Thereafter, the step of applying a laser beam to the optical device wafer 10 having the resin film 24 formed on the back surface 10*b* through the resin film 24 along the street 101 comes next. This laser beam application step is carried out by using the above-mentioned laser beam machine 7 shown in FIGS. 7 to 9. That is, as shown in FIG. 20, the optical device wafer 10 is placed on the chuck table 71 of the laser beam machine 7 in such a manner that a side, on which the resin film 24 is formed, faces up, and suction-held on the chuck table 71. The street 101 formed on the optical device wafer 10 is aligned with the condenser 724 of the laser beam application means 72, thereby performing the alignment of a laser beam application position. This alignment is carried out by an image pick-up means for picking up an image of the street 101 with infrared radiation from the back surface 10*b* of the optical device wafer 10. The predetermined street 101 formed on the optical device wafer 10 is then brought to a position right below the condenser 724 of the laser beam application means 72 to carry out the above laser beam application step. In this laser beam application step, the focusing point P of a pulse laser beam 725 applied from the condenser 724 is set to the back surface 10*b* (top surface) of the optical device wafer 10.

Figure 21:
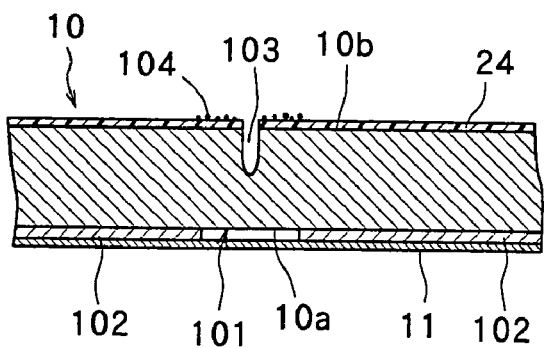
FIG. 21 is an enlarged sectional view of the principal section of the optical device wafer having a laser groove formed by the laser beam application step in the wafer processing method of the present invention.
Figure 22:
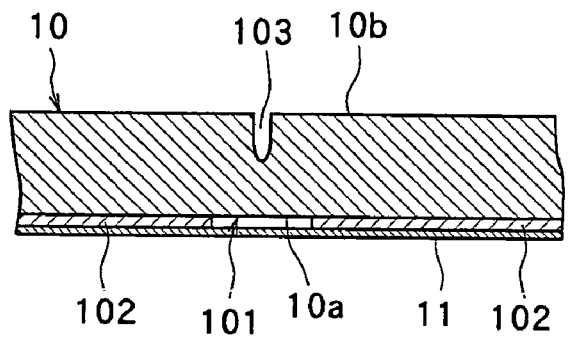
FIG. 22 is an enlarged sectional view of the principal section of the semiconductor wafer from which the resin film formed on the front surface has been removed by the resin film removal step in the wafer processing method of the present invention.

The above laser beam application step is carried out under the following processing conditions, for example.
Light source of laser beam: YVO4 laser or YAG laser
Wavelength: 355 nm
Repetition frequency: 50 to 100 kHz
Output: 1.0 to 3.0 W
Focusing spot diameter: 9.2 μm
Processing-feed rate: 10 to 200 mm/sec In the optical device wafer 10, as shown in FIG. 21, a laser groove 103 is formed along the street 101 from the back surface 10*b* by carrying out the above laser beam application step. In this laser beam application step, when the pulse laser beam 725 is applied to the optical device wafer 10 through the resin film 24 as shown in FIG. 20, as the resin film 24 has the property of absorbing a laser beam, the resin film 24 becomes a processing start point. Since the optical device wafer 10 is processed by the application of the pulse laser beam 725 after the processing start point has been formed in the resin film 24, the generation of impact force caused by the transmission of the pulse laser beam through the resin film can be prevented, thereby suppressing the partial peeling of the resin film 24. Therefore, it is possible to prevent debris from adhering to the periphery of the optical device wafer 10 exposed by the partial peeling of the resin film 24. In the above laser beam application step, debris are produced at the time when the optical device wafer 10 is processed by the application of the pulse laser beam 725. However, as shown in FIG. 21, the debris 104 are blocked by the resin film 24 and hence, adhere to the front surface of the resin film 24 but not to the back surface 10*b* of the optical device wafer 10.

The above step of removing the resin film 24 formed on the back surface 10*b* of the optical device wafer 10 comes after the above laser beam application step is carried out on all the streets 101 formed on the optical device wafer 10. By carrying out this resin film removal step, the resin film 24 formed on the back surface 10*b* of the optical device wafer 10 and also the debris 104 that have been produced in the above laser beam application step and adhered to the resin film 24 are removed.

Figure 23:
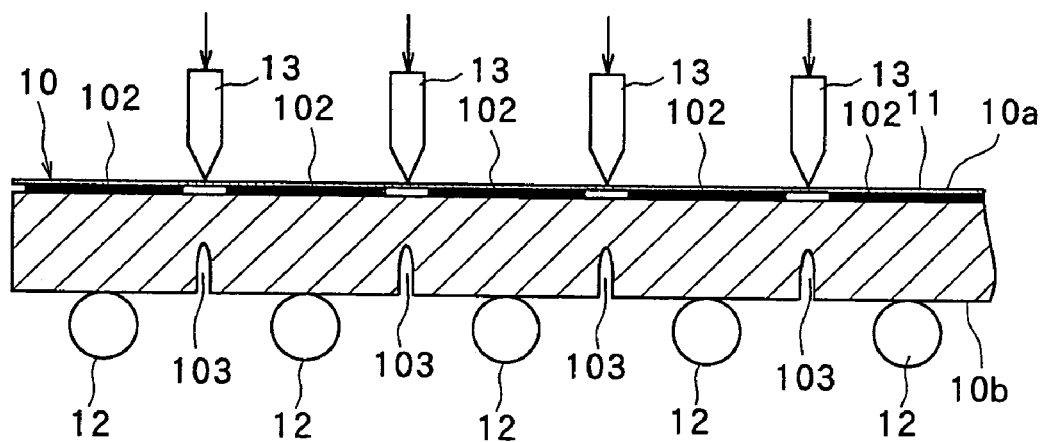
FIGS. 23(a) and 23(b) are explanatory diagrams showing the dividing step in the wafer processing method of the present invention.
Figure 23:
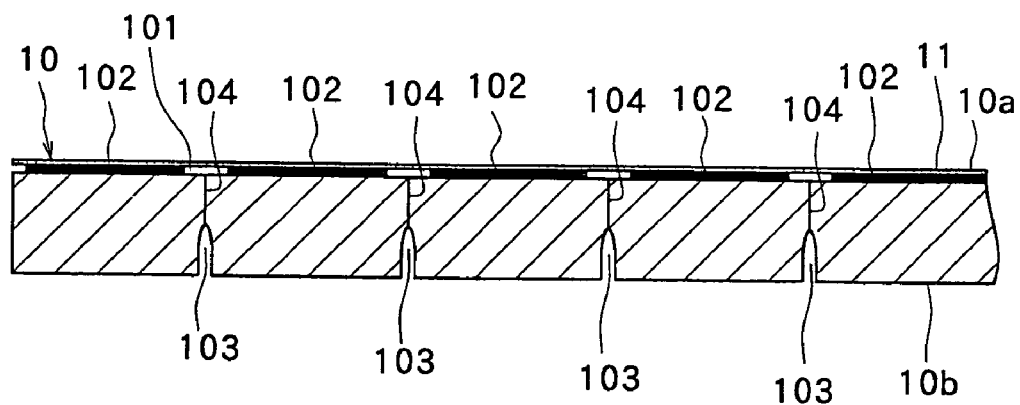

The step of dividing the optical device wafer 10 along the laser grooves 103 formed in the streets 101 follows the above resin film removal step. In this dividing step, the optical device wafer 10 is mounted on a plurality of columnar support members 12 arranged in parallel to one another with its back surface 10*b* facing down, as shown in FIG. 23(*a*). At this point, the laser grooves 103 are positioned between adjacent support members 12 and 12. Pressing members 13 are pressed against the laser grooves 103, that is, the streets 101 from the side of the protective tape 11 affixed to the front surface 10*a* of the optical device wafer 10. As a result, bending load is applied to the optical device wafer 10 along the laser grooves 103, that is, the streets 101 to generate tensile stress on the back surface 10*b*, thereby forming dividing portions 104 in the optical device wafer 10 along the laser grooves 103, that is, the streets 101 formed in a predetermined direction as shown in FIG. 23(*b*) to divide the optical device wafer 10. After the optical device wafer 10 is divided along the laser grooves 103, that is, the streets 101 formed in the predetermined direction, the optical device wafer 10 is turned at 90° to carry out the above dividing work along the laser grooves 103, that is, the streets 101 formed in a direction perpendicular to the above predetermined direction, thereby making it possible to divide the optical device wafer 10 into individual optical devices 102. Since the protective tape 11 is affixed to the front surface 10*a*, the individual optical devices 102 do not fall apart and the form of the optical device wafer 10 is maintained.

Since debris do not adhere to the back surface of the optical device 102 obtained by dividing the optical device wafer 10 along the laser grooves 103 in the above laser beam application step, a reduction in brightness caused by the adhesion of debris to the back surface can be prevented.

As described above, the present invention has been described according to preferred embodiments for dividing the semiconductor wafer and optical device wafer, but the present invention can be applied to the laser processing of other types of wafers.

We claim:

1. A laser processing method for processing a wafer by applying a laser beam to a predetermined area of the wafer, comprising:

a resin film forming step for forming a resin film which absorbs a laser beam, on a surface to be processed of the wafer, wherein the resin film is formed of a water-soluble light absorbing resin prepared by mixing a light absorber with a water-soluble resin;

a laser beam application step for applying a laser beam having a wavelength of 355 nm to the surface to be processed of the wafer through the resin film to form grooves in the wafer; and a resin film removal step for removing the resin film after the laser beam application step.

2. The laser processing method according to claim 1, wherein the resin film has a light absorption coefficient of 1,000/cm or more.

3. The laser processing method according to claim 1, wherein the water-soluble light absorbing resin is a resin prepared by mixing a polyvinyl alcohol with titanium dioxide.

4. The laser processing method according to claim 1, wherein the wafer is a semiconductor wafer comprising semiconductor chips which are composed of a laminate consisting of an insulating film and a functional film and formed on the front surface of a semiconductor substrate and which are sectioned by streets, the resin film forming step is to form the resin film which absorbs a laser beam, on the front surface of the semiconductor substrate, and the laser beam application step is to form laser grooves which reach the semiconductor substrate by applying a laser beam to the laminate forming the streets through the resin film.

5. The laser processing method according to claim 4, wherein the semiconductor wafer having the laser grooves formed by the laser beam application step is cut along the laser grooves with a cutting blade to be divided into individual semiconductor chips.

6. The laser processing method according to claim 1, wherein the wafer is an optical device wafer which has a plurality of streets formed in a lattice pattern on the front surface of a substrate and comprises optical devices formed in a plurality of areas sectioned by the plurality of streets, the resin film forming step is to form the resin film which absorbs a laser beam, on the back surface of the substrate, and the laser beam application step is to form laser grooves in the substrate by applying a laser beam to the back surface of the substrate through the resin film.

7. The laser processing method according to claim 6, wherein the optical device wafer having the laser grooves formed by the laser beam application step is divided into individual optical devices along the laser grooves by applying external force to the laser grooves.

* * * * *